(12) United States Patent
Yu

(10) Patent No.: US 6,414,830 B1
(45) Date of Patent: Jul. 2, 2002

(54) ESD PROTECTION CIRCUIT FOR INTEGRATED CIRCUIT WITH OPERATING VOLTAGES EXCEEDING POWER SUPPLY VOLTAGES

(75) Inventor: Ta-Lee Yu, Hsinchu (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 09/365,458

(22) Filed: Aug. 2, 1999

(30) Foreign Application Priority Data

Jan. 25, 1999 (TW) .......................................... 88101064

(51) Int. Cl.$^7$ ................................................ H02H 9/00
(52) U.S. Cl. ........................................ 361/56; 257/355
(58) Field of Search ........................ 361/59, 91.1, 111, 361/119; 257/91.5, 166, 124, 130, 133, 162, 168, 355

(56) References Cited

U.S. PATENT DOCUMENTS

| 5,159,518 A | * | 10/1992 | Roy | ............................. 361/56 |
| 5,670,799 A | * | 9/1997 | Croft | ........................... 257/173 |
| 5,869,873 A | * | 2/1999 | Yu | ............................. 257/362 |
| 5,909,347 A | * | 6/1999 | Yu | ............................. 361/56 |
| 5,962,876 A | * | 10/1999 | Yu | ............................. 257/133 |

* cited by examiner

Primary Examiner—Ronald W. Leja
(74) Attorney, Agent, or Firm—Beyer, Weaver &Thomas, LLP

(57) ABSTRACT

An ESD protection circuit comprises a semiconductor controlled rectifier and an MOS transistor. The semiconductor controlled rectifier has an anode and a cathode connected to a first circuit node and a second circuit node, respectively. The MOS transistor is connected between the anode and an anode gate of the semiconductor controlled rectifier to increase the magnitude of a turn-on voltage at which the semiconductor controlled rectifier enters a negative forward bias.

15 Claims, 5 Drawing Sheets

US 6,414,830 B1

ESD PROTECTION CIRCUIT FOR INTEGRATED CIRCUIT WITH OPERATING VOLTAGES EXCEEDING POWER SUPPLY VOLTAGES

BACKGROUND OF THE INVENTION

1. Field of the Invention

The present invention generally relates to protection circuitry for integrated circuits. More particularly, the present invention relates to an ESD protection circuit suitable for an integrated circuit with input voltages beyond power supply voltage range.

2. Description of the Related Art

In sub-micron CMOS integrated circuits (ICs), is electrostatic discharge, ESD hereinafter, is a reliability concern. Referring to FIG. 1, a conventional ESD protection circuit fabricated onto a semiconductor substrate is schematically illustrated in a cross-sectional view. The fabricated ESD protection circuit is a lateral semiconductor controlled rectifier. In the drawing, reference numeral 1 designates a core circuit or an internal circuit for an integrated circuit, the core circuit 1 being powered by voltage sources $V_{SS}$ and $V_{DD}$ while operating. Reference numeral 2 represents a bonding pad to which the lateral semiconductor controlled rectifier 3 is electrically connected. During an ESD event, the lateral semiconductor controlled rectifier 3 can turn on to bypass the ESD stress occurring at the bonding pad and thus protect the core circuit 1 from ESD damage.

As shown in FIG. 1, an n-well 11 is formed on a p-type semiconductor substrate 10. A $p^+$ doped region 12 is formed in the n-well 11 as an anode of the lateral semiconductor controlled rectifier 3, while an $n^+$ doped region 13 is formed in the p-type substrate 10 as a cathode of the lateral semiconductor controlled rectifier 3. Moreover, an $n^+$ contact region 14 and a $p^+$ contact region 15 are formed in the n-well 11 and the p-type substrate 10, respectively.

The lateral semiconductor controlled rectifier 3 can be considered as two bipolar transistors T1 and T2. As shown in FIG. 1, the pnp transistor T1 is formed by the anode ($p^+$ doped region 12) as an emitter, the n-well 11 as a base, and the p-type substrate 10 as a collector. The npn transistor T2 is formed by the cathode ($n^+$ doped region 13) as an emitter, the p-type substrate 10 as a base, and the n-well 11 as a collector. Moreover, $R_{well}$ and $R_{sub}$ denote the spreading resistances of the n-well 11 and the p-type substrate 10, respectively. In FIG. 1, the $p^+$ doped region 12 and the $n^+$ contact region 14 are tied together to the bonding pad 2, the $n^+$ doped region 13 and the $p^+$ contact region 15 are tied together to $V_{SS}$, which is grounded under circuit operation.

When ESD stress occurs to the bonding pad 2, the $V_{SS}$ and $V_{DD}$ are not powered, that is, the nodes is floating. If the ESD stress is relatively positive to $V_{SS}$ the junction between the n-well 11 and p-type substrate 10 enters avalanche breakdown to trigger the lateral semiconductor controlled rectifier 3, where the trigger voltage and the trigger current are denoted by $V_{trig}$ and $I_{trig}$, respectively. Therefore, the lateral semiconductor controlled rectifier 3 turns on to conduct a current bypassing the ESD stress, and thus clamp the potential between the anode 12 and the cathode 13 at a holding voltage $V_h$ so as to protect the core circuit 1 from ESD damage. If the ESD stress is relatively negative to $V_{SS}$, the junction between the n-well 11 and p-type substrate 10 is forward-biased to protect the core circuit 1 from ESD damage as well. The I–V characteristic curve of the lateral semiconductor controlled rectifier 3 is shown in FIG. 2.

However, some specific integrated circuits are provided with I/O pins having operational voltages that exceed the range between $V_{SS}$ and $V_{DD}$ under circuit operation. In other words, there are some signals having a potential greater than $V_{DD}$ or less than $V_{SS}$. However, when the signal with a potential lower s than $V_{SS}$ is provided, the junction between the n-well 11 and the p-type substrate 10 will be forward-biased so that the performance of the core circuit 1 is affected.

SUMMARY OF THE INVENTION

Therefore, it is an object of the present invention to provide an ESD protection circuit for an integrated circuit with operating voltages exceeding power supply voltages, which can be turned off under circuit operation without disturbing circuit performance.

For achieving the above-identified object, the present invention provides an ESD protection circuit having a semiconductor controlled rectifier and an MOS transistor. The semiconductor is controlled rectifier has an anode and a cathode connected to a first circuit node and a second circuit node, respectively. The MOS transistor is connected between the anode and an anode gate of the semiconductor controlled rectifier to increase the magnitude of a turn-on voltage at which the semiconductor controlled rectifier enters a negative forward bias.

Moreover, the present invention provides an ESD protection circuit comprising a p-type semiconductor layer having a first contact region, an n-type semiconductor layer having a second contact region, an MOS transistor, and an n-type doped region. The n-type semiconductor layer is in contact with the p-type semiconductor layer to establish a junction therebetween. The MOS transistor is formed in the n-type semiconductor layer with one source/drain region connected to a first circuit node and another source/drain region connected to the second contact region. The n-type doped region is formed in the p-type semiconductor layer and connected with the first contact region to a second circuit node.

Accordingly, the ESD protection of the present invention can be used on those I/O pins having operational voltages that greater than $V_{DD}$ or even less than $V_{SS}$ to ensure that the MOS transistor can turn off under circuit operation without disturbing circuit performance. During an ESD event, the potential between the first and second circuit nodes can still be clamped by the semiconductor controlled rectifier to a low voltage so as to protect a core circuit of an integrated circuit from ESD damage.

BRIEF DESCRIPTION OF DRAWINGS

The following detailed description, given by way of examples and not intended to limit the invention to the embodiments described herein, will best be understood in conjunction with the accompanying drawings, in which.

DETAILED DESCRIPTION OF THE INVENTION

Figure 3:
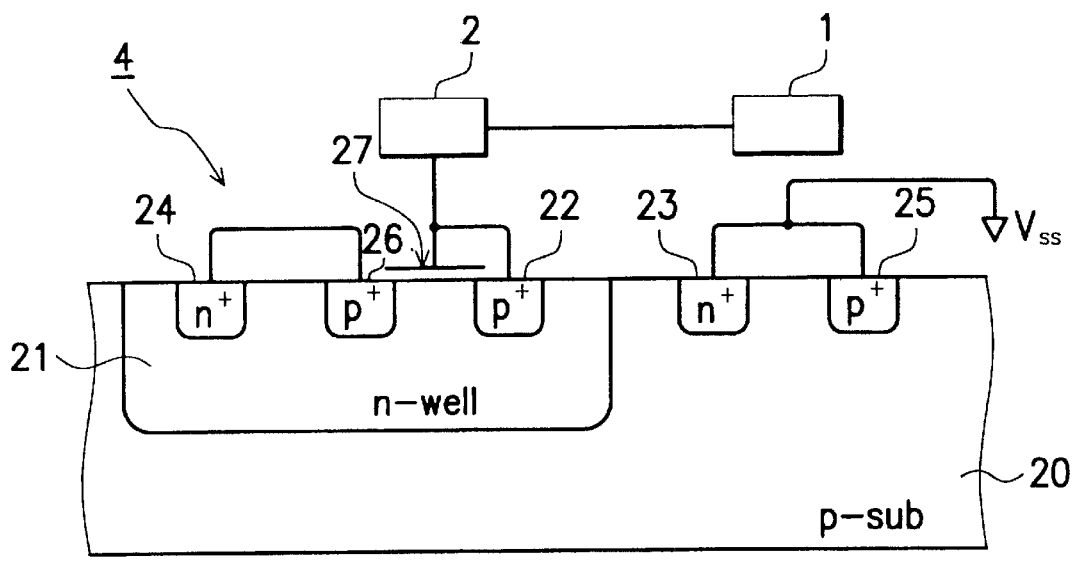
FIG. 3 schematically illustrates an ESD protection circuit in accordance with a first preferred embodiment of the present invention fabricated onto a semiconductor substrate in a cross-sectional view.
Figure 4:
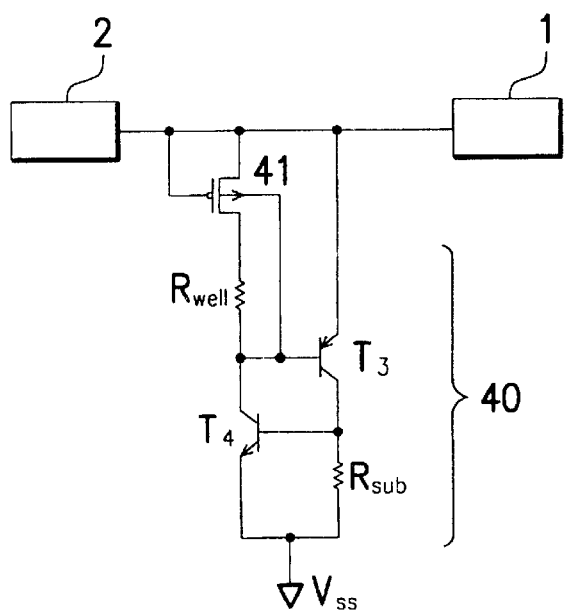
FIG. 4 depicts the equivalent circuit diagram of FIG. 3.

Referring to FIG. 3, an ESD protection circuit in accordance with a first preferred embodiment of the present invention fabricated onto a semiconductor substrate is schematically illustrated in a cross-sectional view. FIG. 4 depicts the equivalent circuit diagram of FIG. 3. In the drawing, reference numeral 1 designates a core circuit or an internal circuit for an integrated circuit, the core circuit 1 being powered by two voltage sources $V_{SS}$ and $V_{DD}$. Reference numeral 2 represents a bonding pad to which the ESD protection circuit 4 of the present invention is electrically connected. During an ESD event the ESD protection circuit 4 is employed to bypass ESD stress occurring at the bonding pad 2 and thus protect the core circuit 1 from ESD damage. According to the present invention, the ESD protection circuit 4 comprises a lateral semiconductor controlled rectifier 40 and an MOS transistor 41.

In FIG. 3, an n-well 21 is formed on a p-type semiconductor substrate 20. A $p^+$ doped region 22 is formed in the n-well 21 as an anode of the lateral semiconductor controlled rectifier 40, while an $n^+$ doped region 23 is formed in the p-type substrate 20 as a cathode of the lateral semiconductor controlled rectifier 40. In addition, the n-well 21 and p-type substrate 20 serve as an anode gate and a cathode gate for the lateral semiconductor controlled rectifier 40, respectively. Moreover, an $n^+$ contact region 24 and a $p^+$ contact region 25 are formed within the n-well 21 and the p-type substrate 20, respectively.

According to the present invention, a $p^+$ doped region 26 is provided between the $p^-$ doped region 22 and the $n^+$ contact region 24. A gate structure 27 is formed to overlie a portion of the n-well 21 between the $p^+$ doped region 22 and the $p^+$ doped region 26 as shown in FIG. 3. Typically, the gate structure 27 includes an dielectric layer and an electrode layer. Preferably, the dielectric layer can be of field oxide or thick oxide.

Figure 1:
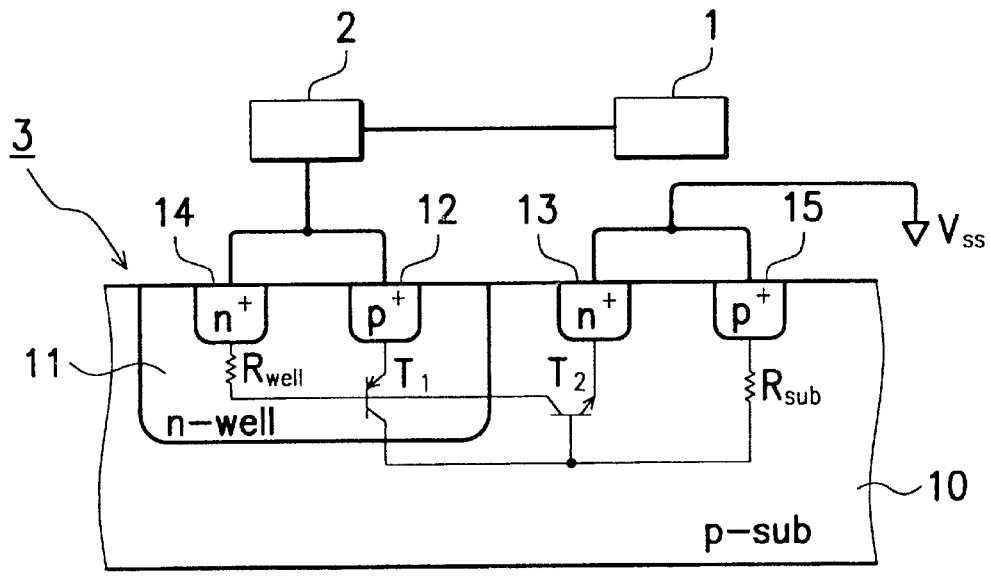
FIG. 1 schematically illustrates a conventional ESD protection circuit fabricated onto a semiconductor substrate in a cross-sectional view.
Figure 2:
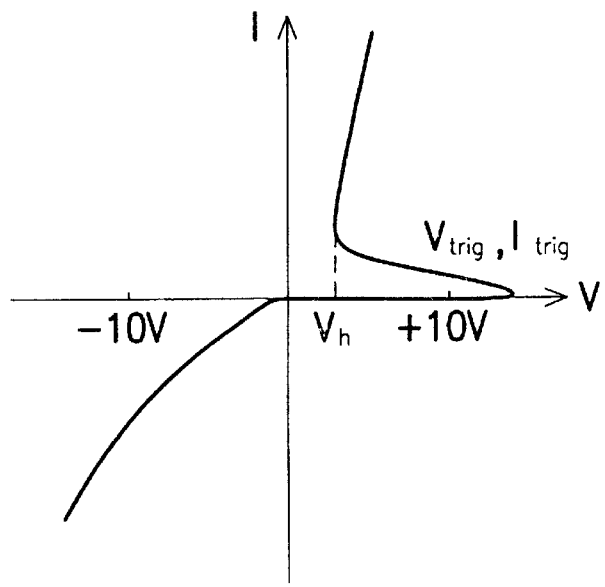
FIG. 2 depicts the I–V characteristic curve of the conventional ESD protection circuit of FIG. 1.

The lateral semiconductor controlled rectifier 40 can be considered as two bipolar transistors T3 and T4. In FIG. 1, the pnp transistor T3 is formed by the anode ($p^+$ doped region 22) as an emitter, the n-well 21 as a base, and the p-type substrate 20 as a collector. The npn transistor T4 is formed by the cathode ($n^-$ doped region 23) as an emitter, the p-type substrate 20 as a base, and the n-well 21 as a collector. Moreover, $R_{well}$ and $R_{sub}$ denote the spreading resistances of the n-well 21 and the p-type substrate 20, respectively.

Furthermore, the $p^+$ doped region 22, the gate structure 27, and the $p^+$ doped region 26 serve as the drain, gate, and source of the MOS transistor 41, respectively, while the n-well 21 serves as the bulk of the MOS transistor 41. It is noted that the MOS transistor 41 should be provided with a high threshold voltage, for example, $|V_T|>10V$. Preferably, the MOS transistor 41 can be a thick oxide device or a field device.

In this embodiment, the $p^+$ doped region 22 and the gate structure 27 are tied together to the bonding pad 2, the $p^+$ doped region 26 and $n^+$ contact region 24 are tied together, and the $n^+$ doped region 23 and the $p^-$ contact region 25 are tied together to $V_{SS}$.

When ESD stress positive to $V_{SS}$ occurs to the bonding pad 2, the MOS transistor 41 turns off and the junction between the n-well 21 and p-type substrate 20 enters avalanche breakdown to trigger the lateral semiconductor controlled rectifier 41. Therefore, the lateral semiconductor controlled rectifier 41 can turn on to conduct a current from the $p^+$ doped region 22, through the n-well 21 and p-type substrate 20, to the $n^+$ doped region 23. Thus, the potential between the potential between the anode 22 and the cathode 23 can be clamped at a holding voltage $V_h$ so as to protect the core circuit 1 from ESD damage.

Figure 5:
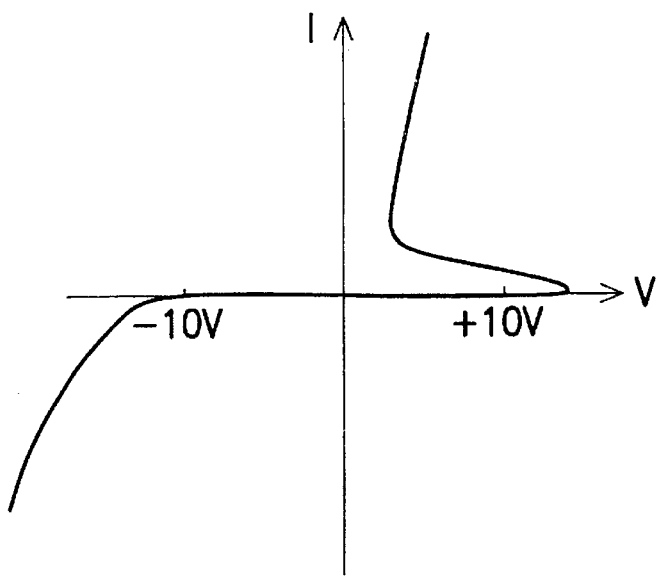
FIG. 5 depicts the I–V characteristic curve of FIG. 3.

When ESD stress negative to $V_{SS}$ occurs to the bonding pad 2 and further to the gate structure 27, an inversion layer can be formed between the $p^+$ doped regions 22 and 26 to turn on the MOS transistor 41. Therefore, the negative ESD stress can be bypassed from pi doped region 22 to the $n^+$ contact region 24 so as to negatively forward-bias the junction between the n-well 21 and p-type substrate 20 and thus clamp the potential between the bonding pad 2 and $V_{SS}$ at a low voltage. Accordingly, the core circuit 1 can be protected from ESD damage. The I–V characteristic curve of the ESD protection circuit 4 in accordance with one preferred embodiment of the present invention is shown in FIG. 5. Note that the turn-on voltage at which the junction between the n-well 21 and p-type substrate 20 is forward-biased negatively can be less than –10V.

Moreover, under circuit operation, $V_{DD}$ is powered (for example by 5V or 3.3V) and $V_{SS}$ is grounded. When some specific integrated circuits are provided with I/O pins having operational voltages that exceed $V_{DD}$, the ESD protection circuit 4 of the present invention can ensure that the lateral semiconductor controlled rectifier 41 can turn off due to the trigger voltage thereof greater than 10V. In addition, if those I/O pins having operational voltages less than $V_{SS}$, the ESD protection circuit 4 of the present invention can ensure that threshold voltage is less than –10V, therefore not disturbing circuit performance.

Accordingly, the ESD protection can be used on those I/O pins having operational voltages greater than $V_{DD}$ or even less than $V_{SS}$ to ensure that the ESD protection circuit 4 can turn off under circuit operation without disturbing circuit performance. During an ESD event, the potential between the bonding pad 2 and $V_{SS}$ can still be clamped to a low voltage so as to protect the core circuit 1 from ESD damage.

Figure 6:
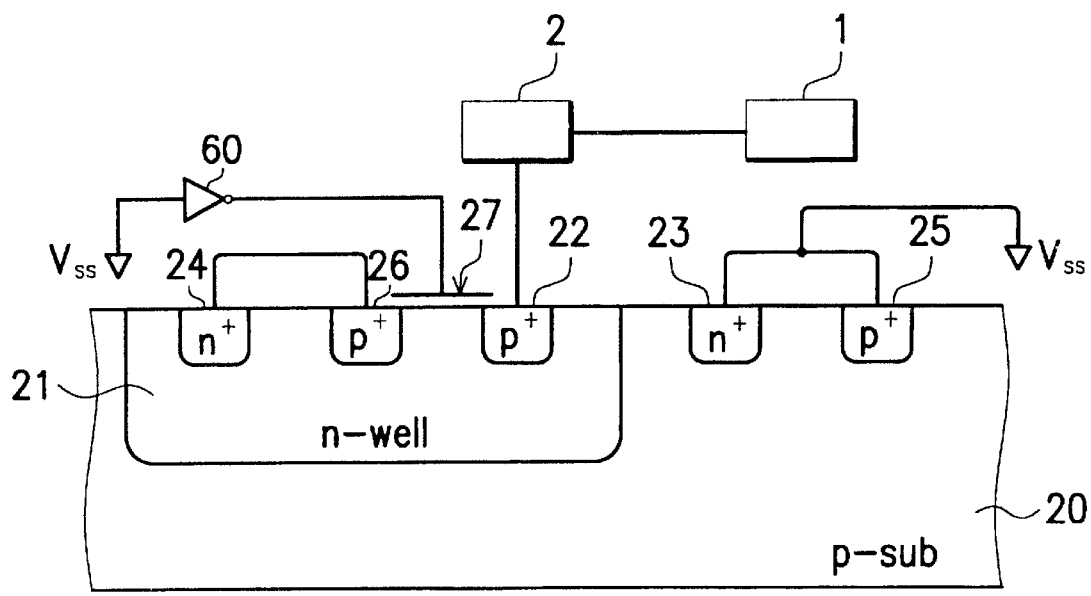
FIG. 6 schematically illustrates an ESD protection circuit in accordance with a second preferred embodiment of the present invention fabricated onto a semiconductor substrate in a cross-sectional view.

As shown in FIG. 6, an ESD protection circuit in accordance with a second preferred embodiment of the present invention fabricated onto a semiconductor substrate is schematically illustrated in a cross-sectional view. In the drawing, $V_{SS}$ is coupled to the gate structure 27 through an inverter 60.

Figure 7:
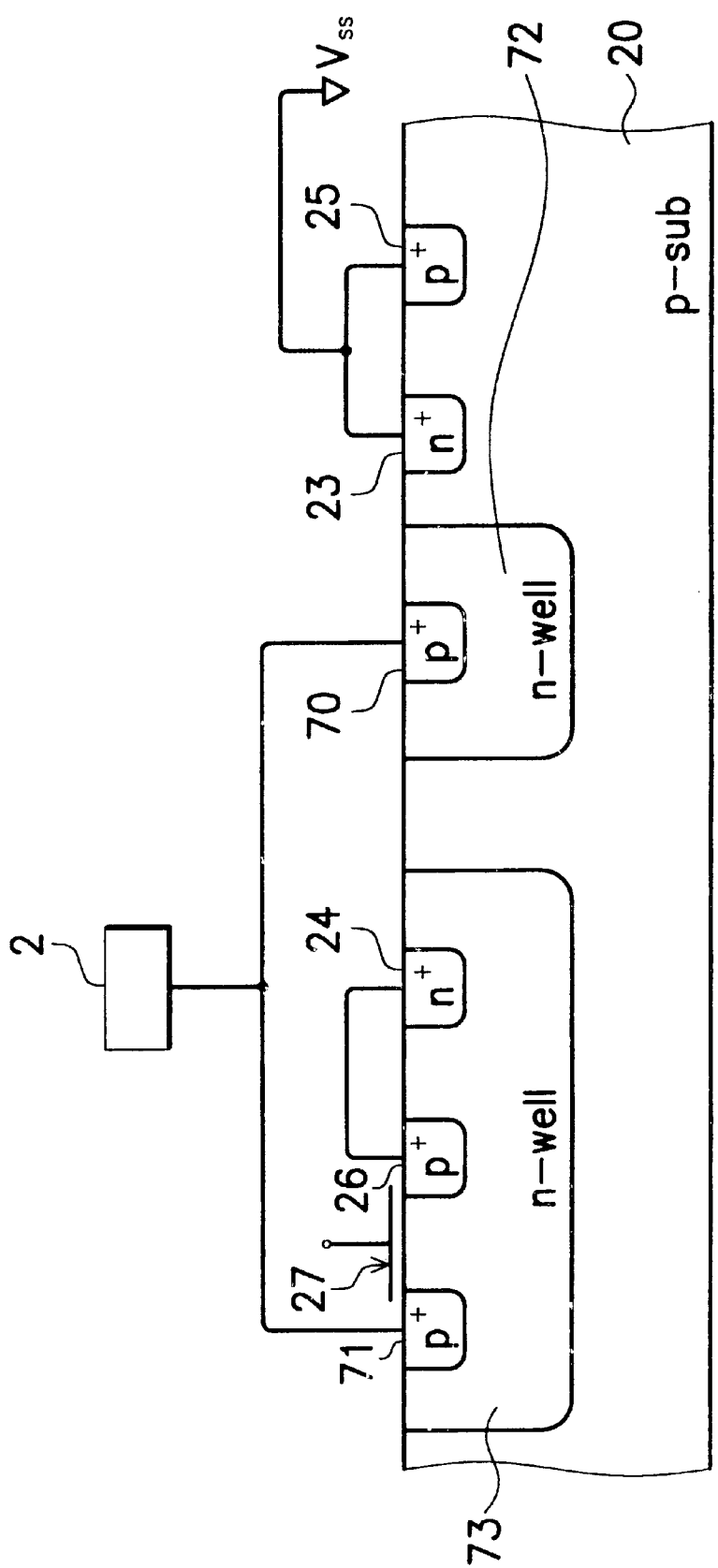
FIG. 7 schematically illustrates an ESD protection circuit in accordance with a third preferred embodiment of the present invention fabricated onto a semiconductor substrate in a cross-sectional view.

Referring to FIG. 7, an ESD protection circuit in accordance with a third preferred embodiment of the present invention fabricated onto a semiconductor substrate is schematically illustrated in a cross-sectional view. The $p^+$ doped region 22 of FIG. 3 is divided into two $p^+$ doped regions 70 and 71 formed in n-wells 72 and 73, respectively. The $p^+$ doped regions 70 and 71 are tied together. In this embodiment, the MOS transistor 40 is formed within the n-well 73, as are the $p^+$ doped region 26 and the $n^+$ contact region 24. The gate structure 27 is formed to cover a portion of the n-well 73 between the $p^+$ doped regions 71 an 26.

Figure 8:
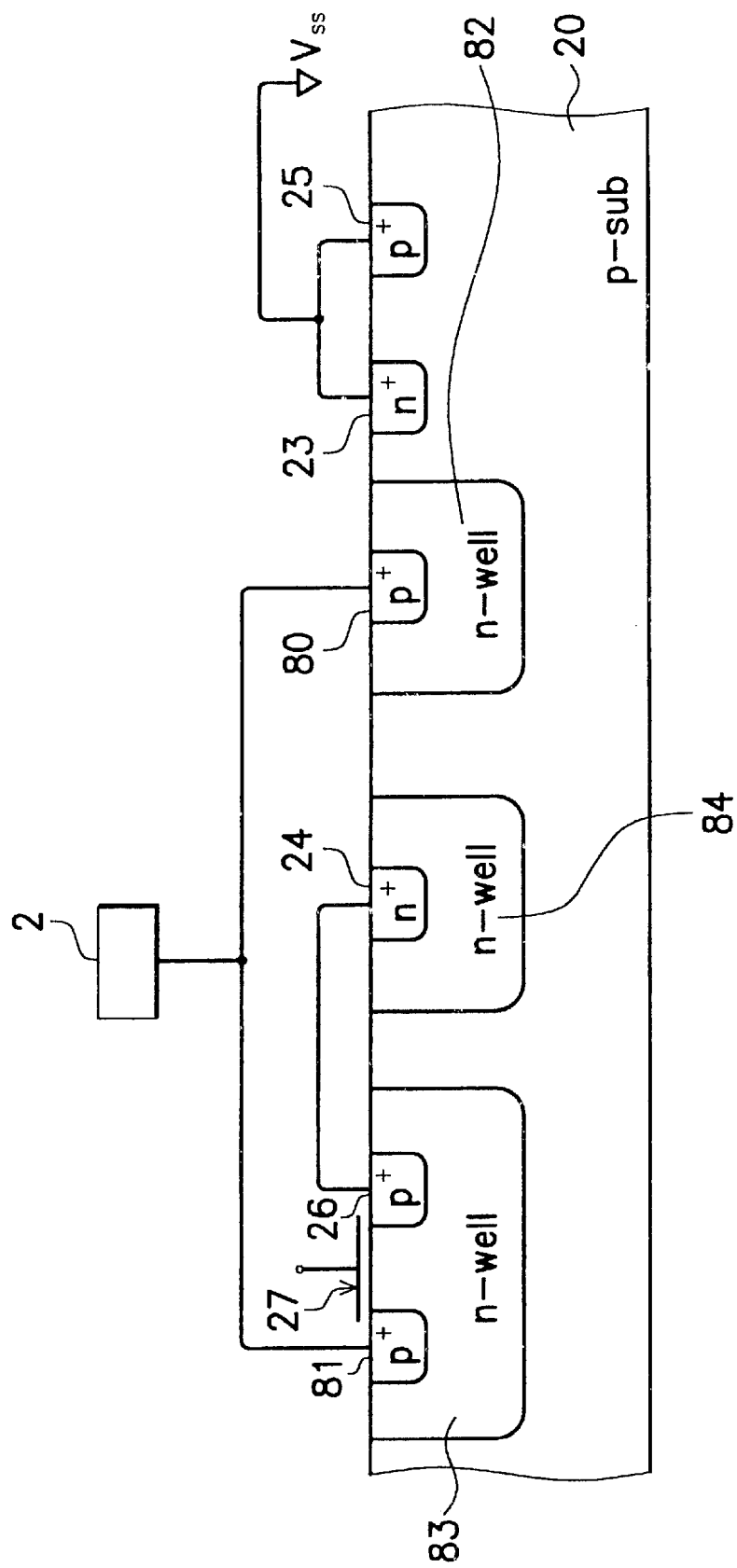
FIG. 8 schematically illustrates an ESD protection circuit in accordance with a fourth preferred embodiment of the present invention fabricated onto a semiconductor substrate in a cross-sectional view.

FIG. 8 schematically illustrates an ESD protection circuit in accordance with a fourth preferred embodiment of the present invention fabricated onto a semiconductor substrate in a cross-sectional view. The $p^+$ doped region 22 of FIG. 3 is divided into two $p^+$ doped regions 80 and 81 formed in n-wells 82 and 83, respectively. The $p^+$ doped regions 80 and 81 are tied together. The n+ doped region 24 is formed in other n-well 84, individually. In this embodiment, the MOS transistor 40 is formed in the n-well 83 thereby forming the p+ doped region 26 within the n-well 83 and forming the gate structure 27 overlying a portion of the n-well 83 between the p+ doped regions 81 an 26.

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. An ESD protection circuit, comprising:
   a semiconductor controlled rectifier having an anode and a cathode connected to a first circuit node and a second circuit node, respectively;
   an MOS transistor connected between said anode and an anode gate of said semiconductor controlled rectifier to increase the magnitude of a turn-on voltage at which said semiconductor controlled rectifier enters a negative forward bias.

2. The circuit as claimed in claim 1, wherein said MOS transistor is a PMOS transistor having a pair of source/drain regions connected to said anode and said anode gate, respectively.

3. The circuit as claimed in claim 1, wherein said first circuit node is connected to a bonding pad.

4. An ESD protection circuit, comprising:
   a semiconductor controlled rectifier having an anode and a cathode connected to a first circuit node and a second circuit node, respectively; and
   a PMOS transistor having a pair of source/drain regions connected to said anode and an anode gate respectively of said semiconductor controlled rectifier and a gate connected to said first circuit node to increase the magnitude of a turn-on voltage at which said semiconductor controlled rectifier enters a negative forward bias.

5. The circuit as claimed in claim 4, wherein said first circuit node is connected to a bonding pad.

6. An ESD protection circuit, comprising:
   a semiconductor controlled rectifier having an anode and a cathode connected to a first circuit node and a second circuit node, respectively;
   a PMOS transistor having a pair of source/drain regions connected to said anode and an anode gate respectively of said semiconductor controlled rectifier, wherein said PMOS transistor is connected to increase the magnitude of a turn-on voltage at which said semiconductor controlled rectifier enters a negative forward bias; and
   an inverter having an input terminal connected to said second circuit node and an output terminal connected to a gate of said PMOS transistor.

7. The circuit as claimed in claim 6, wherein said first circuit node is connected to a bonding pad.

8. An ESD protection circuit, comprising:
   a p-type semiconductor layer having a first contact region;
   an n-type semiconductor layer in contact with said p-type semiconductor layer to establish a junction therebetween, said n-type semiconductor layer having a second contact region;
   an MOS transistor formed in said n-type semiconductor layer,
   said MOS transistor having one source/drain region connected to a first circuit node and another source/drain region connected to said second contact region;
   an n-type doped region formed in said p-type semiconductor layer and connected with said first contact region to a second circuit node; and
   an inverter having an input terminal connected to said second circuit node and an output terminal connected to a gate of said MOS transistor.

9. The circuit as claimed in claim 8, wherein said first circuit node is connected to a bonding pad.

10. An ESD protection circuit, comprising:
    a p-type semiconductor substrate having a first contact region;
    a first and second n-type layers formed in said semiconductor substrate, said first n-type layer having a second contact region;
    an MOS transistor formed in said first n-type layer, said MOS transistor having one source/drain region connected to a first circuit node and another source/drain region connected to said second contact region;
    a p-type doped region formed in said second n-type layer and connected to said first circuit node; and
    an n-type doped region formed in said semiconductor substrate and connected with said first contact region to a second circuit node.

11. The circuit as claimed in claim 10, wherein said first circuit node is connected to a bonding pad.

12. An ESD protection circuit, comprising:
    a p-type semiconductor substrate having a first contact region;
    a first and second n-type layers formed in said semiconductor substrate, said first n-type layer having a second contact region;
    an MOS transistor formed in said first n-type layer, said MOS transistor having one source/drain-region connected to a first circuit node and another source/drain region connected to said second contact region and a gate connected to said first circuit node;
    a p-type doped region formed in said second n-type layer and connected to said first circuit node; and
    an n-type doped region formed in said semiconductor substrate and connected with said first contact region to a second circuit node.

13. The circuit as claimed in claim 12, wherein said first circuit node is connected to a bonding pad.

14. An ESD protection circuit, comprising:
    a p-type semiconductor substrate having a first contact region;
    a first and second n-type layers formed in said semiconductor substrate, said first n-type in layer having a second contact region;
    an MOS transistor formed in said first n-type layer, said MOS transistor having one source/drain-region connected to a first circuit node and another source/drain region connected to said second contact region;
    a p-type doped region formed in said second n-type layer and connected to said first circuit node;
    an n-type doped region formed in said semiconductor substrate and connected with said first contact region to a second circuit node; and
    an inverter having an input terminal connected to said second circuit node and an output terminal connected to a gate of said MOS transistor.

15. The circuit as claimed in claim 14, wherein said first circuit node is connected to a bonding pad.

* * * * *